(12) United States Patent
Gay

(10) Patent No.: US 9,111,607 B2
(45) Date of Patent: Aug. 18, 2015

(54) MULTIPLE DATA RATE MEMORY WITH READ TIMING INFORMATION

(71) Applicant: James G. Gay, Pflugerville, TX (US)

(72) Inventor: James G. Gay, Pflugerville, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/907,484

(22) Filed: May 31, 2013

(65) Prior Publication Data

US 2014/0355366 A1 Dec. 4, 2014

(51) Int. Cl.
*G11C 7/22* (2006.01)
*G06F 13/16* (2006.01)
*G06F 13/42* (2006.01)
*G11C 7/10* (2006.01)

(52) U.S. Cl.
CPC ............ *G11C 7/222* (2013.01); *G06F 13/1689* (2013.01); *G06F 13/4243* (2013.01); *G11C 7/1066* (2013.01)

(58) Field of Classification Search
USPC ........................................................ 365/193
See application file for complete search history.

(56) References Cited

U.S. PATENT DOCUMENTS

| 6,397,312 | B1* | 5/2002 | Nakano et al. ................. 711/167 |
| 6,789,209 | B1 | 9/2004 | Suzuki et al. |
| 2005/0138277 | A1 | 6/2005 | Koo |
| 2008/0031079 | A1 | 2/2008 | Osawa et al. |
| 2009/0168559 | A1* | 7/2009 | Seo ........................... 365/189.15 |
| 2009/0219779 | A1 | 9/2009 | Mao et al. |
| 2010/0067314 | A1* | 3/2010 | Ware ........................ 365/189.15 |
| 2010/0309744 | A1 | 12/2010 | Park |
| 2012/0120741 | A1* | 5/2012 | Kim et al. ................ 365/189.14 |
| 2013/0136195 | A1 | 5/2013 | Nygren et al. |

FOREIGN PATENT DOCUMENTS

WO 2008063199 A1 5/2008

OTHER PUBLICATIONS

JEDEC Standard, "Double Data Rate (DDR) SDRAM Specification", JESD79E (revision of JESD79D), May 2005, pp. 22-30.
JEDEC Standard, "DDR2 SDRAM Specification", JESD79-2E (revision of JESD79-2D), Apr. 2008, pp. 32-37.
JEDEC Standard, "DDR3 SDRAM Specification", JESD79-3D (revision of JESD79D-3C, Nov. 2008), Sep. 2009, pp. 56-67.
JEDEC Standard, "Low Power Double Data Rate (LPDDR) SDRAM Standard", JESD209A (revision of JESD209, Aug. 2007), Feb. 2009, pp. 28-34.
JEDEC Standard, "Low Power Double Data Rate 2 (LPDDR2)", JESD209-2B, Jun. 2009, pp. 82-88.
Jedec JC-42.3C DRAM Parametric, "DDR3L-800/1066/1333/1600 Spec Addendum", 1.35V DDR3L Specification Addendum to JESD79-3D, Dec. 2009, pp. 1-26.
Jedec Standard, "DDR4 SDRAM Specification", Aug. 2012, pp. 1-26.
U.S. Appl. No. 14/190,193, Office Action—Rejection, mailed Apr. 7, 2015.

* cited by examiner

*Primary Examiner* — Anthan Tran

(57) ABSTRACT

A memory includes a memory array, read circuitry, and a strobe generator. The read circuitry is configured to provide read data from the memory array in response to a read request, wherein the read circuitry provides the read data in accordance with a first clock. The strobe generator is configured to provide a strobe signal with the read data, wherein the strobe generator provides the strobe signal in accordance with a second clock. The second clock is out of phase with the first clock by a phase in a range of 30 degrees to 150 degrees.

6 Claims, 3 Drawing Sheets

MULTIPLE DATA RATE MEMORY WITH READ TIMING INFORMATION

BACKGROUND

1. Field

This disclosure relates generally to multiple data rate memories and more particularly, with timing information for aiding in performing a read of data provided by the memory.

2. Related Art

Multiple data rate memories have become very popular, especially for DRAMs but also other types of memories such as non-volatile memories. Most commonly they are double data rate (DDR) memories in which data is provided on both halves of a clock cycle. In a read of the DDR memory by a controller, the data is provided by the DDR memory in a burst of data that is accompanied by a data strobe signal, sometimes referenced as a DQS signal, that provides assistance to the controller in reading the data. This data, arriving at twice the clock frequency, pushes the limits of being able to be read. The DQS signal is delayed very carefully by DQS circuitry in the controller so that the data can be properly read. This DQS circuitry is typically very critical in achieving effective reading but the circuitry can be sensitive to temperature and voltage as well as process variations. Thus, an effective design of the DQS circuitry can be time consuming and require much more space than would normally be expected of a delay circuit. Due to the sensitivity of the DQS circuitry, a process improvement can actually create reliability problems for this delay circuit.

Accordingly there is a need to provide further improvement in providing timing for data being read from a multiple data rate memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a system having a multiple rate memory and a controller, the multiple rate memory provides data at a multiple rate of a clock and also provides a strobe that is delayed in relation to the beginning of the data. The result is a simpler way to provide read timing for the read by the controller of data from the memory. This is better understood by reference to the FIGs. and the following written description.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
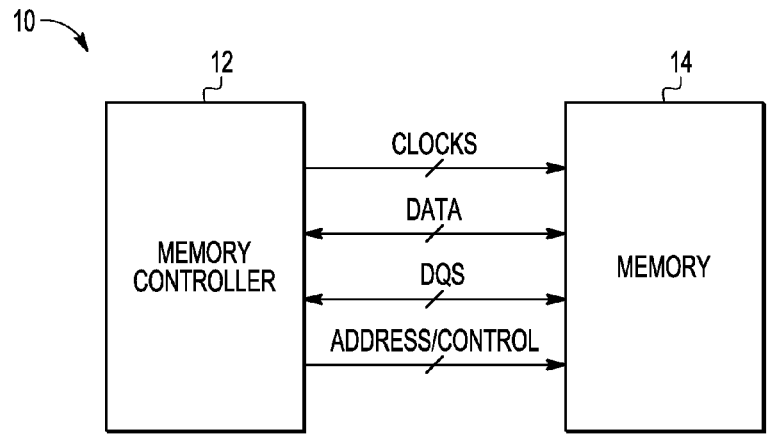
FIG. 1 is a block diagram of a system having a memory according to an embodiment.

Shown in FIG. 1 is a system 10 comprising a memory controller 12 and a memory 14 which can operate at a multiple data rate. In this particular case the rate is double the frequency of the clock. This is common for multiple data rate memories but quadruple data rate memories may be feasible. Memory controller 12 reads data from memory 14 and writes data to memory 14. Memory controller 12 provides clocks to memory 14 as well as addresses and other control signals. For writes to memory 14, memory controller 12 provides DQS signals to memory 14. For reads of data from memory 14, memory controller 12 receives the DQS signals from memory 14. The clock signals include clock signals C and Cb, which are the master clock and its complement, respectively. The clock signals further include phase shift clock PSC and complementary phase shift clock PSCb. The DQS signals, for a read include data strobe signal DQS and complementary data strobe signal DQSb.

Figure 2:
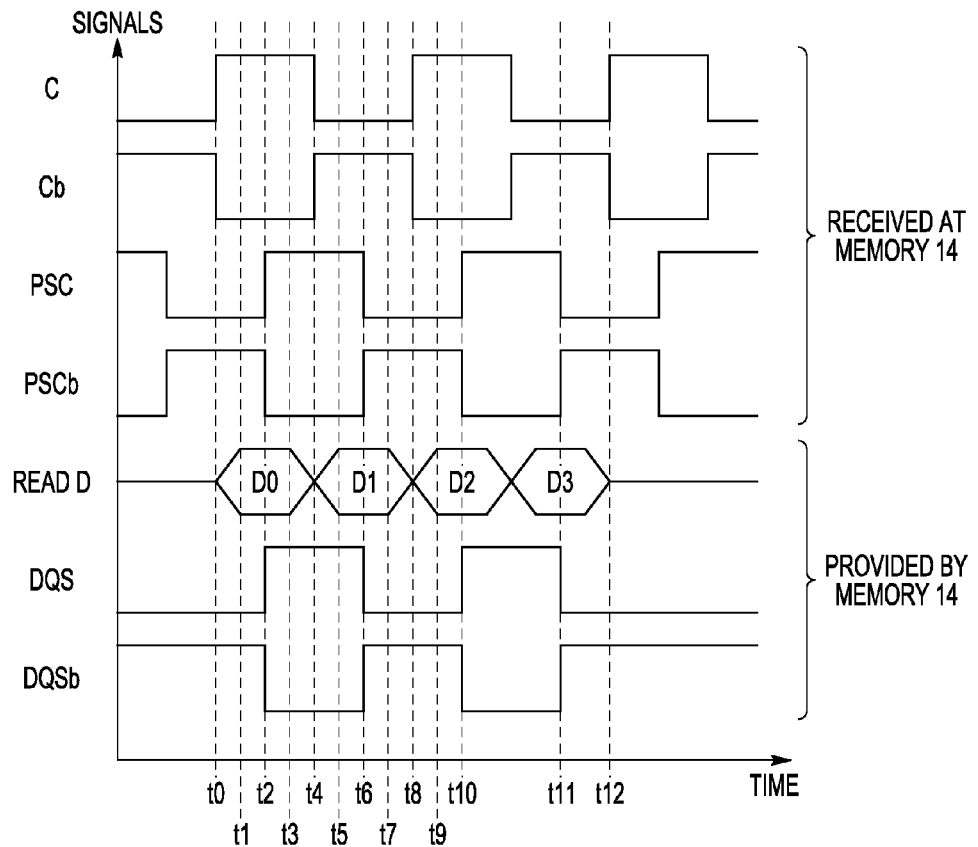
FIG. 2 is a timing diagram for signals used in the system of FIG. 1

Shown in FIG. 2, is a timing diagram for a read operation showing clock signals C and Cb, phase shift clocks PSC and PSCb, read data D0, D1, D2, and D3, data strobe signals DQS and DQSb. Clocks C and Cb and phase shift clocks PSC and PSCb normally operate without interruption and may be referenced as free running clocks. In this example there are four data beats; one each for read data D0, D1, D2, and D3. A data beat occurs between consecutive edges of clock C and Cb. Each coincident edge of clocks C and Cb may be referenced as a picket. Thus a data beat may be considered to be between consecutive pickets. Read data is provided from memory 14 during a read operation. Data strobe signals DQS and DQSb operate only during a read operation and are provided from memory 14 to provide the timing for memory controller 12 to properly read the read data. When a read is not occurring, data strobe DQS is at a logic low and complementary data strobe DQSb is at a logic high. At time t0, as shown in FIG. 2, read data is just beginning to be sent to memory controller 12 at a time when clock C is switching from a logic low to a logic high, complementary clock Cb is switching from a logic high to a logic low, phase shift clock PSC is a logic low and phase shift clock PSCb is at a logic high, data strobe DQS is a logic low, and data strobe DQSb is a logic high.

At time t1, read data D0 has had enough time to be in a condition to be read. This point in time is the beginning of the setup time for the read. The data must be valid for a sufficient time to be reliably read. At a time t2, phase shift signals PSC and PSCb switch logic states. In response to phase shift signals PSC and PSCb switching states, strobe signal DQS switches to a logic high, and DQSb signal switches to a logic low which enables the sensing to begin. In order for sensing to be reliable, data must be held in a valid condition for sufficient time. This time is commonly referenced as the hold time. The hold time provided in this example is from time t2 to time t3. At time t3 data D0 begins changing to an invalid state. At time t4, clock C and clock Cb switch states which completes a half cycle of clocks C and Cb and read data D1 begins to become active. This also completes one data beat. At time t5, data D1 becomes valid and thus begins the period of setup time for the reading of read data D1. At time t6, the read begins in response to data strobe signal DQS switching to a logic low and data strobe signal DQSb switching to a logic high which in turn are in response to phase shift clocks PSC and PSCb switching to a logic low and logic high, respectively. At time t7, read data D1 is no longer valid and the hold time is over. At time t8 the data beat is over for read data D1 as clock C switches to a logic high and complementary clock switch to a logic low. This completes one cycle of clock C with two data beats in which read data D0 and D1 have been provided to memory controller 12 and begins the third beat with read data D3. This is also the beginning of the second clock cycle in which read data D2 is beginning to develop. At time t9, data D2 becomes valid and begins the setup time. At time t10, read data D2 begins being read in response to data strobe signal DQS switching to a logic high and complementary DQSb switching to a logic low. The process continues with the completion of the read of D2 and then the beginning of the read of read data D3 at time t11 when data strobe signal DQS switches to a logic low and complementary DQSb switches to a logic high. The completion of the read of read data D3 is at time t12 which is when clock C and complementary clock Cb switch to a logic high and a logic low, respectively. From time t0 to time t12, two complete cycles of clock C and four data beats are complete.

The timing provided by data strobe signals DSQ and DSQb provide for precise timing as to when the reading of data signals D0, D1, D2, and D3 begins. The phase difference provided is 90 degrees. That is, the rising edge of data strobe DQS is delayed by one fourth of a cycle, a cycle being 360 degrees, relative to clock C. The data itself is timed relative to clock C but the sensing of that data needs to be delayed relative to clock C for reading that data. The 90 degree delay is provided by memory 14 at the time of transmitting the data to memory controller 12. The 90 degree phase shift provides for the setup time and the hold time to be equal which is easily obtained by having access to the clock, clock C or Cb, which is used to initiate the transfer of data to memory controller 12. Thus, with memory 14 transmitting the data with clock C, then a precise delay of data strobe DQS is relatively simple compared to establishing a delay based upon receiving a data strobe that does not have the desired timing at the time of transmission as has been the case in typical DDR DRAMs that comply with the relevant JEDEC standard.

Figure 3:
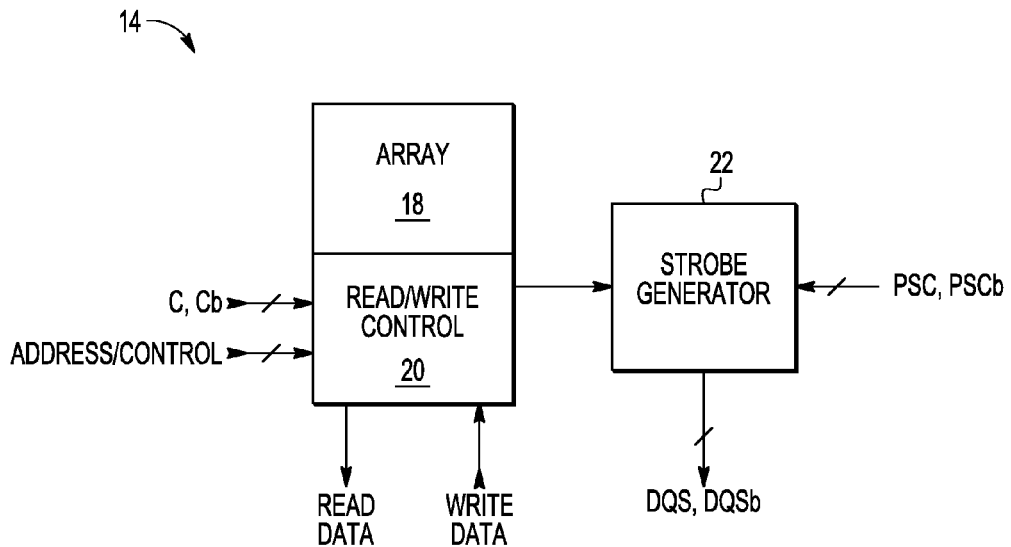
FIG. 3 is a block diagram of the memory of FIG. 1.

Shown in FIG. 3 is memory 14 in more detail showing an array 18 coupled to a read/write control circuit 20 and a strobe generator 22 that receives phase shift clock PSC and complementary phase shift clock PSCb from memory controller 12 coupled to read/write control circuit 20. Array 18 stores the data that is provided as the read data in response to address/control signals and clock signals C and Cb provided by memory controller 12. Strobe generator begins providing data strobe signals DQS and DQSb in response to read/write control circuit 20 indicating that read data is to be transmitted to memory controller 12. When being provided, data strobe signal follows the edges of phase shift clock PSC with minimal delay. This shows that memory 14 receives both clock C and phase shift clock PSC from memory controller 12 with phase shift clock shifted by 90 degrees. This 90 degrees differential is easily generated by memory controller 12 and then maintained by both clock C and phase shift clock PSC being transmitted to memory 14. Data strobe signal DQS is then generated with phase shift clock PSC to very accurately have the 90 degree shift. Clock C and phase shift clock PSC may be generated from a doubled clock C. Because clock C and phase shift clock PSC traverse paths that are inherently substantially the same and can be designed to be very closely the same, the 90 degree phase shift is maintained.

If a different phase shift is desired this same approach can be used to create and maintain the desired phase shift. For example, the set up time requirement may be very different than the hold time. Thus a 30 degree phase shift may be desirable if the setup time requirement is relatively short. On the other hand, a 150 degree delay may be desirable if the hold time requirement is relatively short.

Figure 4:
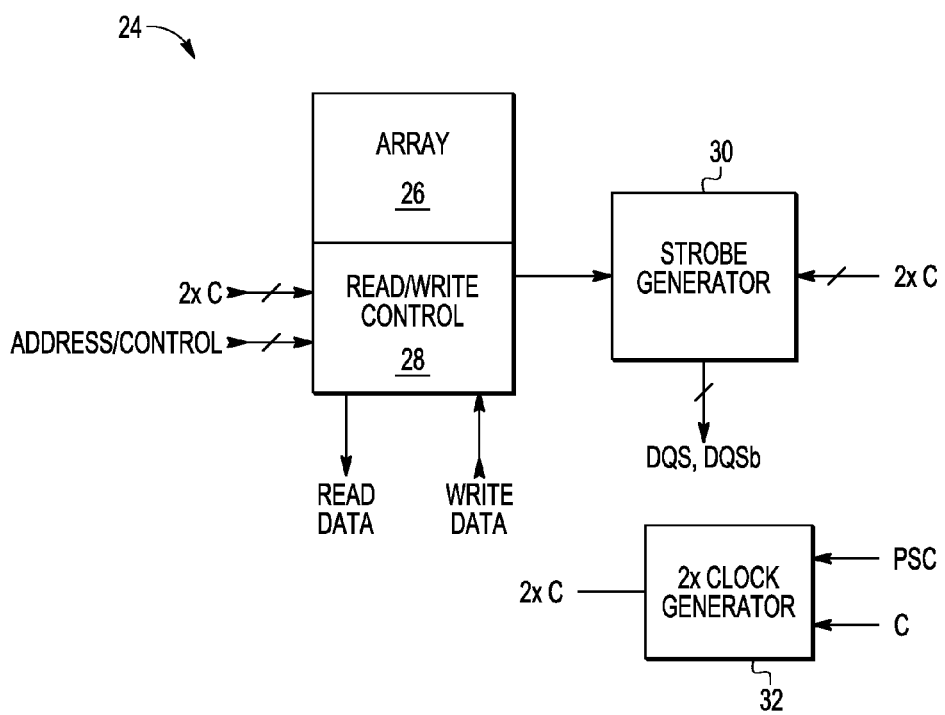
FIG. 4 is a block diagram of a memory that may replace the memory of FIG. 1.

Shown in FIG. 4 is an alternative memory 24 to that of memory 14 having an array 26 coupled to a read/write control circuit 28, a strobe generator 30 coupled to read/write control circuit 28, and a 2× clock generator 32. In this case clock C and phase shift clock PSC generate a 2× clock 2×c that is double the frequency of clock C. With clock phase shift clock PSC 90 degrees out of phase with clock C, 2× clock 2×c can be easily generated with an exclusive OR circuit. The 2× clock 2×c is useful in developing the double data rate output by read/write control circuit 28. When read/write control circuit 28 is getting ready to provide data, it signals strobe generator 30 to provide data strobe signal DQS and complementary data strobe signal DQSb. Data strobe signal DQS is obtained by having its edges, which alternate between positive going an negative going, triggered by the negative edges of 2× clock 2×c. Complementary data strobe clock DQSb is simply the inverse of data strobe clock DQS. The principle is the same in that phase shift clock PSC and clock C traverse very similar paths and thus maintain the phase shift that was generated for them by memory controller 12.

Figure 5:
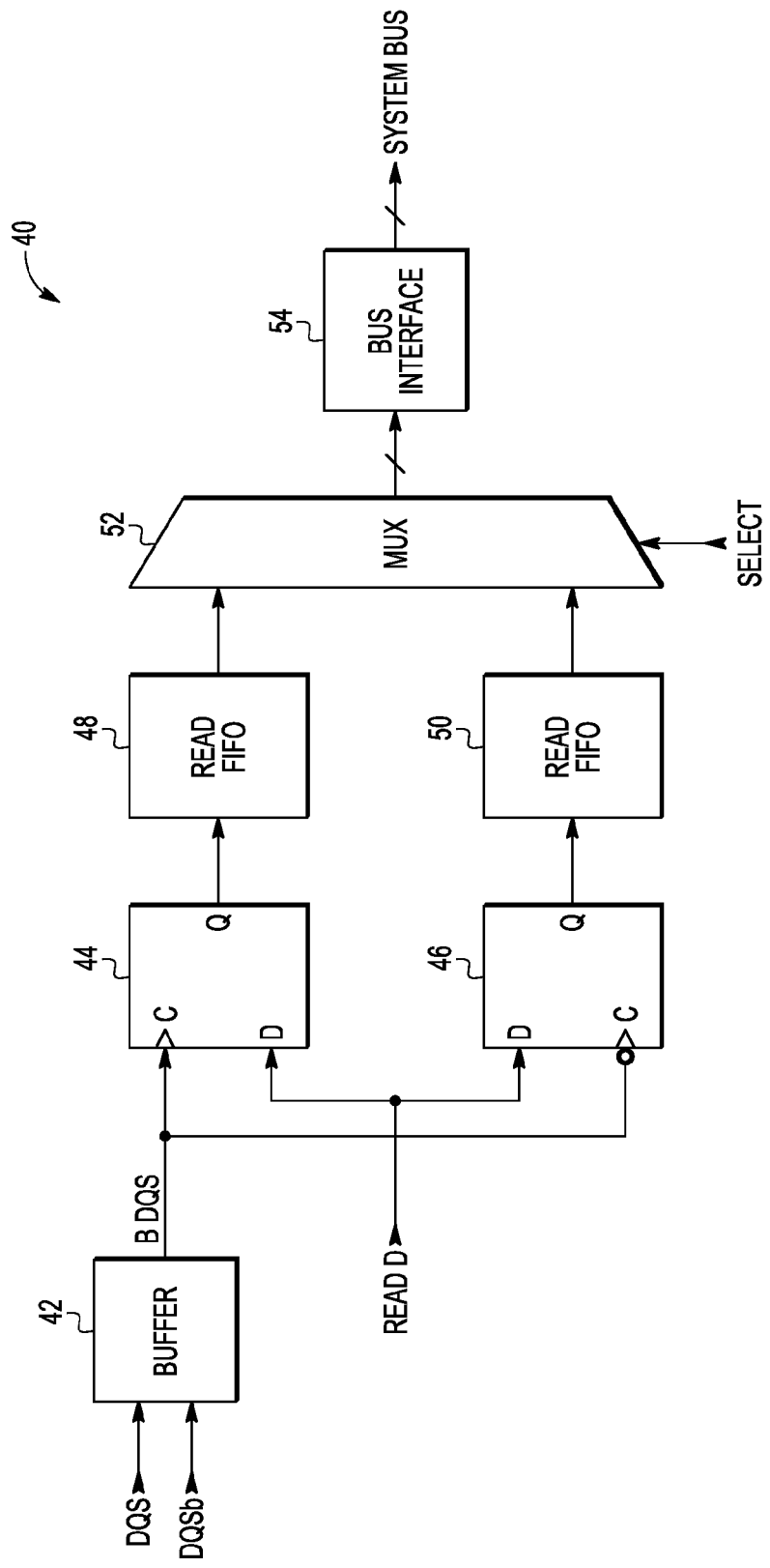
FIG. 5 is a portion of a memory controller used in the system of FIG. 1.

Shown in FIG. 5 is a read circuit 40 that is a portion of memory controller 12 comprising a buffer 42 that receives data strobe signals DQS and DQSb and provides a buffered data strobe signal BDQS to a clock input C of an edge triggered flip-flop 44, an edge triggered flip-flop 46, a read FIFO 48, a read FIFO 50, a multiplexer 52, and a bus interface 54 that has an output coupled to a system bus. Flip-flop 44 has a data input coupled to receive read data D and an output Q coupled to an input of read FIFO 48. Flip-flop 46 has an inverting clock input for receiving buffered data strobe signal BDQS, a data input for receiving read data D, and an output Q coupled to an input of read FIFO 50. Multiplexer 52 has a first input coupled to an output of read FIFO 48, a second input coupled to an output of read FIFO 50, and an output coupled to an input of bus interface 54. Read data D may be buffered as well. The generation of buffered data strobe signal BDQS may not need both data strobe signals DQS and DQSb.

In operation, read data D is received by flip-flop 44 on the rising edge of clock C as shown in FIG. 2 at time t0. The read data D, which is data D0 at this stage, is then clocked into flip-flop 44 at time t2 by the rising edge of buffered date strobe BDQS. Flip-flop 44 then loads the read data into read FIFO 48. At time t4 the next edge of clock C, which is the rising edge of complementary clock Cb, read data D is then received by flip-flop 46. At time t6, buffered data strobe BDQS switches to a logic low which causes flip-flop 46 to load the state of read data D1 which then loads read FIFO 50 with the state of read data D1. This continues until all of the data being read is loaded into read FIFOs 48 and 50. At such time as the data is requested to be provided onto the system bus, multiplexer 52 alternates between read FIFOs 48 and 50 in providing the data to bus interface 54 which in turn provides the data onto the system bus.

As can be seen the reading of data by flip-flops 44 and 46 is clocked by buffered data strobe BDQS which can provide a very accurate relationship between clock C and the desired delay in triggering flip-flops 44 and 46 as a percentage of the clock cycle. In this example, 90 degrees, which as a percentage is 25 percent of a cycle, was chosen as the optimum for providing the set up and hold times needed by flip-flops 44 and 46.

By now it should be appreciated that there has been provided a memory including a memory array, read circuitry, and a strobe generator. The read circuit is coupled to the memory array and configured to provide read data from the memory array in response to a read request. The read circuitry provides the read data in accordance with a first clock. The strobe generator is configured to provide a strobe signal with the read data. The strobe generator provides the strobe signal in accordance with a second clock which is out of phase with the first clock by a phase in a range of 30 degrees to 150 degrees. The memory may have a further characterization by which the strobe generator is configured to transition the strobe signal at rising and falling edges of the second clock. The memory may have a further characterization by which the strobe generator is configured to receive the second clock and an inverse of the second clock, and is configured to transition the strobe signal at zero crossings of the second clock and the inverse of the second clock. The memory may have a further characterization by which the second clock is 90 degrees out of phase with the first clock. The memory may have a further characterization by which the first clock and the second clock have different frequencies. The memory may have a further characterization by which the read circuitry is configured to provide data beats of read data at rising and falling edges of the first clock. The memory may have a further characterization by which the read circuitry is configured to provide multiple data beats between a rising edge and an immediately successive falling edge of the first clock. The memory may have a further characterization by which the read circuitry is configured to provide the read data to a memory controller and the strobe generator is configured to provide the strobe signal to a memory controller. The memory may have a further characterization by which the read circuitry is configured to receive the first clock from the memory controller, and the strobe generator is configured to receive the second clock from the memory controller. The memory may have a further characterization by which the strobe generator is configured to receive a third clock, wherein the third clock is generated from a combination of the first and second clocks, and has a higher frequency than each of the first clock and the second clock. The memory may have a further characterization by which the read circuitry is configured to provide the read data at a first edge type of the third clock, and the strobe generator is configured to transition the strobe signal at a second edge type, different from the first edge type, of the third clock, wherein each of the first edge type and the second edge type is one of a rising or falling edge. The memory may have a further characterization by which each transition of the strobe signal occurs during a corresponding data beat of the read data.

Also disclosed is a method used in a memory. The method includes receiving a read request. In response to receiving the read request, providing read data from the memory array in accordance with a first clock and providing a strobe signal with the read data in accordance with a second clock, wherein the second clock is out of phase with the first clock by a phase in a range of 30 degrees to 150 degrees. The method may have a further characterization by which providing the read data comprises providing data beats of the read data at rising and falling edges of the first clock and providing the strobe signal comprises transitioning the strobe signal between a first level and a second level at rising and falling edges of the second clock. The method may have a further characterization by which the second clock is 90 degrees out of phase with the first clock. The method may have a further characterization by which providing transitions of the strobe signal at rising and falling edges of the second clock comprises providing transitions of the strobe signal at zero crossings of the second clock and an inverse of the second clock. The method may further include combining the first clock and the second clock to generate a third clock which has a higher frequency than each of the first clock and the second clock and wherein providing the read data comprises providing data beats of the read data at a first edge type of the third clock and providing the strobe signal comprises transitioning the strobe signal between a first level and a second level at a second edge type of the third clock, different from the first edge type, wherein each of the first edge type and the second edge type is one of a rising or falling edge. The method may have a further characterization by which the providing the strobe signal with the read data comprises transitioning the strobe signal between a first level and a second level during each successive data beat of the read data.

Disclosed also is a memory system including a memory controller and a memory. The memory controller is configured to provide a first clock, a second clock, and read requests, wherein the second clock is out of phase with the first clock by a phase in a range of 30 degrees to 150 degrees. The memory is coupled to the memory controller and configured to receive the first clock, the second clock and the read requests. The memory includes a memory array. The memory further includes read circuitry coupled to the memory array and configured to provide read data from the memory array to the memory controller in response to a read request, wherein the read circuitry provides the read data to the memory controller in accordance with a first clock. The memory further includes a strobe generator configured to provide a strobe signal with the read data to the memory controller, wherein the strobe generator provides the strobe signal in accordance with a second clock. The memory controller may have a further characterization by which the strobe generator is configured to transition the strobe signal at rising and falling edges of the second clock, and the read circuitry is configured to provide data beats of read data at rising and falling edges of the first clock.

Although the invention is described herein with reference to specific embodiments, various modifications and changes can be made without departing from the scope of the present invention as set forth in the claims below. For example, a different mechanism for generating the gating enable signals may be used. Thus, where positive edges are described for triggering an event, negative edges may be used instead. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   a memory array;
   read circuitry coupled to the memory array and configured to provide read data from the memory array in response to a read request, wherein the read circuitry provides the read data in accordance with a first clock; and a strobe generator configured to provide a strobe signal with the read data, wherein the strobe generator provides the strobe signal in accordance with a second clock which is out of phase with the first clock by a phase in a range of 30 degrees to 150 degrees;

wherein the strobe generator is configured to transition the strobe signal at rising and falling edges of the second clock;

wherein the strobe generator is configured to receive the second clock and an inverse of the second clock, and is configured to transition the strobe signal at zero crossings of the second clock and the inverse of the second clock.

2. A memory comprising:

a memory array;

read circuitry coupled to the memory array and configured to provide read data from the memory array in response to a read request, wherein the read circuitry provides the read data in accordance with a first clock; and a strobe generator configured to provide a strobe signal with the read data, wherein the strobe generator provides the strobe signal in accordance with a second clock which is out of phase with the first clock by a phase in a range of 30 degrees to 150 degrees;

wherein the strobe generator is configured to transition the strobe signal at rising and falling edges of the second clock;

wherein the first clock and the second clock have different frequencies.

3. A memory comprising:

a memory array;

read circuitry coupled to the memory array and configured to provide read data from the memory array in response to a read request, wherein the read circuitry provides the read data in accordance with a first clock; and a strobe generator configured to provide a strobe signal with the read data, wherein the strobe generator provides the strobe signal in accordance with a second clock which is out of phase with the first clock by a phase in a range of 30 degrees to 150 degrees;

wherein the strobe generator is configured to receive a third clock, wherein the third clock is generated from a combination of the first and second clocks, and has a higher frequency than each of the first clock and the second clock.

4. The memory of claim 3, wherein the read circuitry is configured to provide the read data at a first edge type of the third clock, and the strobe generator is configured to transition the strobe signal at a second edge type, different from the first edge type, of the third clock, wherein each of the first edge type and the second edge type is one of a rising or falling edge.

5. In a memory having a memory array, a method comprising:

receiving a read request; and in response to the read request:

providing read data from the memory array in accordance with a first clock, and providing a strobe signal with the read data in accordance with a second clock, wherein the second clock is out of phase with the first clock by a phase in a range of 30 degrees to 150 degrees;

wherein providing the read data comprises providing data beats of the read data at rising and falling edges of the first clock;

wherein providing the strobe signal comprises transitioninq the strobe signal between a first level and a second level at rising and falling edges of the second clock; and wherein providing transitions of the strobe signal at rising and falling edges of the second clock comprises providing transitions of the strobe signal at zero crossings of the second clock and an inverse of the second clock.

6. In a memory having a memory array, a method comprising:

receiving a read request;

in response to the read request:

providing read data from the memory array in accordance with a first clock, and providing a strobe signal with the read data in accordance with a second clock, wherein the second clock is out of phase with the first clock by a phase in a range of 30 degrees to 150 degrees;

combining the first clock and the second clock to generate a third clock which has a higher frequency than each of the first clock and the second clock, wherein:

providing the read data comprises providing data beats of the read data at a first edge type of the third clock; and providing the strobe signal comprises transitioning the strobe signal between a first level and a second level at a second edge type of the third clock, different from the first edge type, wherein each of the first edge type and the second edge type is one of a rising or falling edge.

* * * * *